United States Patent [19]
Metcalf

[11] 3,737,891
[45] June 5, 1973

[54] DIGITAL VOLTMETER

[75] Inventor: Eric Metcalf, Farnborough, England

[73] Assignee: The Solartron Electronic Group Limited, Farnborough, England

[22] Filed: May 7, 1971

[21] Appl. No.: 141,327

[30] Foreign Application Priority Data

May 11, 1970 Great Britain....................22,750/70

[52] U.S. Cl...........................................340/347 CC
[51] Int. Cl...........................................H03k 13/02
[58] Field of Search..................340/347 NT, 347 CC, 340/347 AD; 324/130, 99, 115; 235/154

[56] References Cited

UNITED STATES PATENTS

| | | | |
|---|---|---|---|
| 3,491,295 | 1/1970 | Van Saun | 340/347 AD |
| 3,488,588 | 1/1970 | Deavenport | 340/347 AD |
| 3,530,458 | 9/1970 | Willard | 340/347 NT |
| 3,541,319 | 11/1970 | James | 340/347 NT |
| 3,533,098 | 10/1970 | Munoz | 340/347 CC |

*Primary Examiner*—Thomas A. Robinson
*Assistant Examiner*—Jeremiah Glassman
*Attorney*—William R. Sherman, Stewart F. Moore, Jerry M. Presson, Leonard R. Fellen and Roylance, Abrams, Berdo & Kaul

[57] ABSTRACT

An input voltage is converted to a digital output by applying the voltage to a voltage to frequency converter whose output is counted for a measured interval. To obtain high digital resolution with a short measurement interval, the *v* to *f* frequency at full scale input is very high. The voltmeter is linearized by completing a loop from the *v* to *f* converter, through a frequency divider and a standard charge generator supplying a fixed pulse of charge for each pulse from the divider, to a smoothing circuit which provides a voltage opposing the input voltage. The frequency divider is included because of the said high frequency, but then the slow speed of the pulses from the divider at small inputs causes the fixed pulses of charge to be inadequately smoothed. Therefore a digital to analogue converter is driven off the frequency divider binary stages to provide a periodic staircase ramp function which is a.c. coupled into the smoothing circuit to cancel out the a.c. component of the inadequately smoothed pulses.

Auto-calibration is provided at both plus and minus full scale input, enabling both zero offset and slope of the voltmeter calibration line to be corrected.

23 Claims, 6 Drawing Figures

DIGITAL VOLTMETER

This invention relates to analogue to digital converters, whose principal use is as digital voltmeters. A well known form of converter is a voltage to frequency converter whose output is countered by a counter over a timed interval to provide the digital valve. A voltage to frequency (*v* to *f*) converter is commonly provided by an integrator which integrates the analogue input and is discharged each time its output reaches a trigger level and this generates an output pulse. A *v* to *f* converter is ordinarily a somewhat non-linear device and it has therefore been proposed to increase the accuracy of the analogue to digital converter by including the *v* to *f* converter in a feedback loop which further includes a linear frequency to voltage (*f* to *v*) converter. The f to v converter generates a smoothed feedback voltage proportional to the frequency of the pulses provided by the *v* to *f* converter and the *v* to *f* converter operates on the difference between the input voltage and the feedback voltage.

It is possible in this way to achieve a highly sensitive and linear analogue to digital converter, which makes high resolution available; that is to say a very small fraction of the full scale reading can be measured significantly. Obviously a small fraction of the full scale reading can only be discriminated digitally if the full scale count of the converter is correspondingly high. It is equally obvious that this can only be so if the said timed interval is sufficiently long or if the frequency of the *v* to *f* converter caused by a full scale input is sufficiently high.

A long measurement interval is normally unacceptable. It is required to take measurements rapidly, typically within 20 ms, which period is one period at 50 Hz mains and therefore integrates out mains period noise. On the other hand, at very high frequencies, e.g., 5MHz, the *f* to *v* converter begins to lose its linearity (because of the restricted switching speeds of transistors therein), thus destroying the overall linearity and making the high resolution meaningless.

One essential feature of the present invention is the use of a frequency divider between the *v* to *f* converter and the *f* to *v* converter. This overcomes the particular problem just described, since a high *v* to *f* output frequency can be fed to the counter to give a high resolution digital output while the input frequency to the *f* to *v* converter remains at an acceptably lower value. However, this feature by itself is insufficient because another problem is created. At small input voltages the pulses to the *f* to *v* converter occur so slowly that the smoothing filter supplying the feedback voltage cannot effect proper smoothing. (The time constant of this filter cannot be made too long; otherwise the instrument will not settle quickly enough.) The object of the present invention is to overcome this problem also.

According to the present invention there is provided an analogue to digital converter comprising a voltage to frequency converter responsive to the difference between the input voltage and a feedback voltage to provide pulses at a rate proportional to the input voltage, and a feedback circuit responsive to the said pulses to provide the feedback voltage, the feedback circuit comprising a counter arranged to divide the said pulses by a number N to provide further pulses, charge generating means responsive to each further pulse to feed a fixed pulse of charge into a smoothing filter whose output provides the feedback voltage, and a digital to analogue converter digitally responsive to the counter to provide an analogue signal which is a.c. coupled into the filter and which exhibits a cyclic staircase waveform which at least partially cancels the a.c. component of the smoothed pulses of charge.

Analogue to digital converters are normally required to be able to accept an input of either polarity (bipolar operation). Since it proves unsatisfactory to provide bipolar operation of the *f* to *v* converter it is preferred to apply a full scale analogue offset to the instrument, so that the *v* to *f* converter measures an effective input in the range 0 to $2V_M$ where $V_M$ is the full scale input, the output counter being preferably arranged in a manner known per se to adopt counts in the corresponding range $-D_M$ to $D_M$ where $D_M$ is the full scale digital output. Another feature of the present invention is the way in which the offset is applied, namely by applying the feedback voltage and a reference offset voltage to the two inputs of a differential amplifier whose output provides the voltage which is differenced with the input voltage. The differential amplifier can participate in the feedback voltage smoothing by the inclusion of a feedback capacitor in parallel with a resistor.

Preferably range switching is effected by an attenuator following the differential amplifier. This is preferred because an input voltage attenuator reduces the input impedance.

Another feature of the invention detects overloads in an improved manner and in particular detects a substantially instantaneous overload, not merely an average overload over the whole measurement interval. It will be appreciated that, if only an average overload is detected and a very brief overload has occurred, the converter can give an erroneous digital output without any warning that this is the case.

Thus, according to the invention in another aspect, an analogue to digital converter with a *v* to *f* converter comprises a counter responsive to the output of the *v* to *f* converter to count in one sense and means for causing the counter to count in the other sense at intervals, which are short compared with the measurement interval, whereby so long as no overload input exists the counts in the other sense balance those in the one sense, whereas an overload input causes the counter to reach a particular state signalling the overload.

Preferably, when an overload is signalled, the *v* to *f* converter is inhibited, to prevent the counter which counts the digital output going beyond its maximum counting rate.

The invention is further concerned with automatic calibration of an analogue to digital converter. It is known in principle to effect such calibration by periodically applying a reference input to the converter and deriving an offset-correcting voltage to deal with any error. This provision enables only zero offset errors to be corrected whereas errors in slope may well also be present.

According to yet another feature of the invention therefore an automatic calibration circuit is arranged to effect calibration with two different reference inputs and to derive two corresponding calibration voltages, means being provided responsive to those two voltages to derive firstly an offset correction voltage for correcting zero offset and secondly a correction voltage which adjusts the slope of the *f* to *v* converter.

An embodiment of the invention incorporating all the above mentioned features will now be described, by way of example, with reference to the accompanying drawings, in which.

Figure 1:
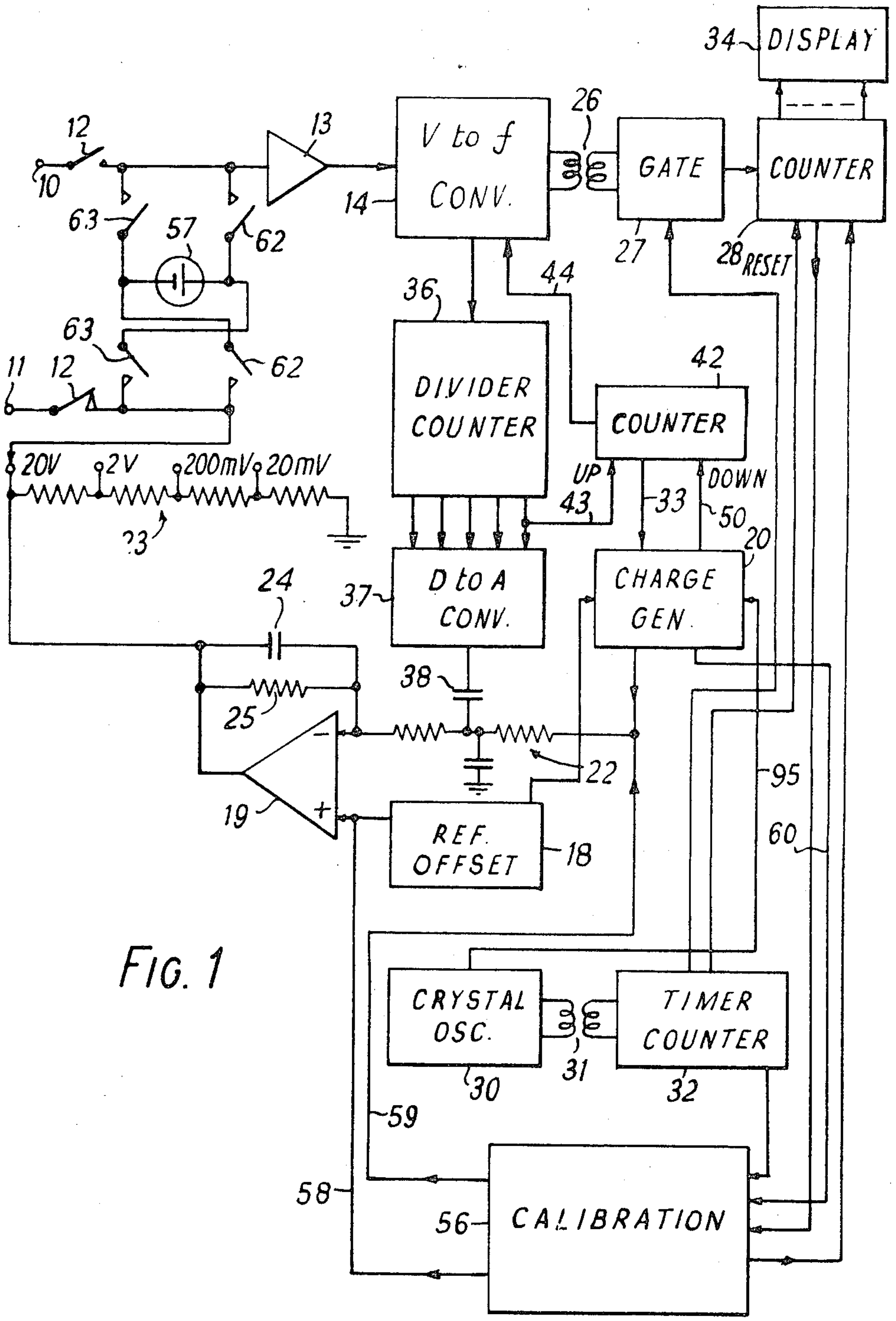
FIG. 1 is a general block diagram of an analogue to digital converter.

Referring to FIG. 1, two input terminals 10 and 11 are provided for a floating input voltage of either polarity. A double pole switch 12 isolates the input during automatic calibration.

A potentiometric arrangement is employed in which the terminal 10 is connected through an input amplifier 13 to a *v* to *f* converter 14 whose output is applied via an *f* to *v* converter to derive a feedback voltage applied to terminal 11. The feedback voltage has a full scale reference offset voltage from a source 18 subtracted therefrom by means of a differential amplifier 19. The *f* to *v* converter comprises a standard charge generator 20 which generates a pulse of accurately defined width and amplitude in response to each input pulse, followed by a smoothing filter 22. Further filtering can optionally be provided by a feedback capacitor 24 and resistor 25 connected across the differential amplifier 19.

The standard charge pulses are generated as rectangular pulses whose width and height are both accurately determined. The width is determined (as described below in relation to FIG. 5) by an extremely stable crystal oscillator 30 which, when enabled by a pulse received on an input line 33 of the circuit 20, closes a transistor switch 96 (FIG. 4) for a predetermined interval. This switch applies an accurately determined voltage, derived from the source 18 to a resistor, through which the standard charge thus flows to the filter 22.

The output of the differential amplifier 19 is connected to the terminal 11 through a switched attenuator 23 provided for range switching purposes. As illustrated the ranges are 20V, 2V, 200 mV and 20mV.

The output pulses of the *v* to *f* converter are coupled via a transformer 26 and a gate 27 to a reversible counter 28. The stable crystal oscillator 30 is coupled by a transformer 31 to a timer counter 32 which times all operations of the instrument. Thus the counter 32 periodically resets the counter 28 and then opens the gate 27 for a measurement interval, e.g., 20 ms. The pulses which pass to the counter 28 provide the digital output of the instrument, this being displayed on a display device 34, e.g., cold cathode number tubes. It is arranged, in known manner, that the counter 28 and display device 34 present both the magnitude and the sign of the input voltage.

Pulses from the *v* to *f* converter are also applied to the input 33 of the charge generator 20, but not directly. Rather the pulses are divided in frequency by 32 by applying the pulses via a 5-bit binary counter 36, and also via another counter 42 whose function is described below. This allows high resolution in the counter 28 without requiring either a high pulse rate from the *v* to *f* converter 14 or too long a measurement period.

Figures 2A, 2B, 2C, 2D:
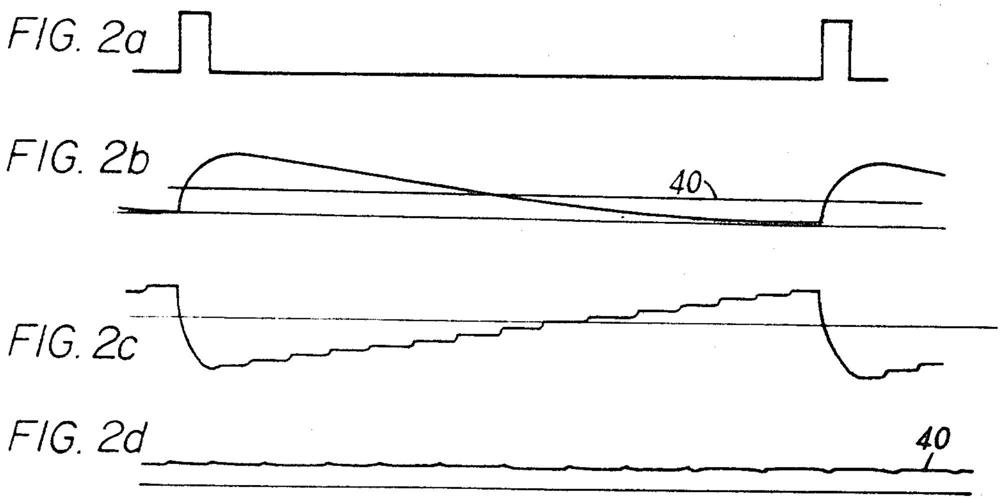
FIG. 2 shows explanatory waveforms.

However, consider the situation when a very small input is applied and the output pulses from the counter 36 are slow. These pulses are shown at (a) in FIG. 2 and the corresponding output of the filter 22 is shown at (b), demonstrating an inadequately smoothed feedback voltage. To overcome this defect the five stages of the counter 36 are coupled to a digital to analogue converter 37, which can consist simply of binary weighted resistors connected between the counter stages and a summing junction, whose output is coupled into the filter 22 via a capacitor 38, which thus also forms part of the filter. Since the counter 36 cycles repeatedly through its 32 states, the output of the converter 37 is a staircase ramp as shown in FIG. 2 at (*c*), less than 32 steps being shown for simplicity. It is a simple matter to arrange that the phase, polarity and amplitude of the staircase ramp are as shown whereby the ramp substantially balances out the AC component of the partially smoothed voltage (*b*), to give an adequate smoothed feedback signal as shown at (*d*). Since the staircase ramp is AC coupled through the capacitor 38 its DC level is zero. Therefore the combined signal (*d*) correctly preserves the DC level 40 of the signal (*b*). Thus a properly smoothed feedback signal is created which allows the instrument to settle correctly to a reading in one measurement interval, even when the input is small.

We turn now to the detection of an overload condition. This is effected by another reversible counter 42 connected to the overflow output 43 of the frequency divider 36. Briefly the counter counts up one in response to each pulse from the divider 36 and then counts down one when a signal appears on connection 50 in response to the operation of the circuit 20. Provided no further count up pulse is received within the period before the count down signal appears, the counter 42 maintains a state of dynamic balance. Under an overload condition however, even if this exists only for a small part of the measurement interval, the pulse rate of the *v* to *f* converter becomes so high that the counter 42 receives another count up pulse before it has been counted down and therefore enters a state which is detected as an overload state. A signal is then provided on a line 44 and this may be used in any convenient way to signal that an overload has occurred and is used to inhibit the operation of the *v* to *f* converter so long as the signal exists. Such inhibition can be readily achieved by clamping the integrator in the *v* to *f* converter for example.

The circuit described will automatically stabilize during an overload (because a closed control loop is created) in such a manner as to make the average rate at which pulses are generated by the *v* to *f* converter 14 equal the maximum allowed rate, i.e., the full scale rate.

Figure 3:
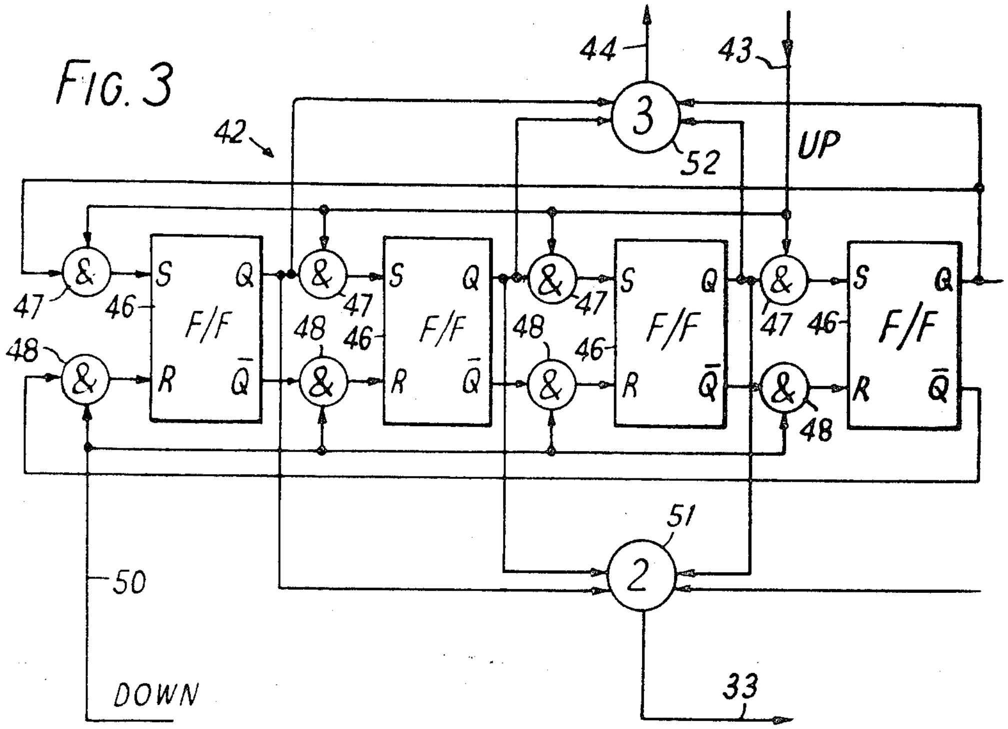
FIG. 3 shows the details of an overload detection counter.

The preferred circuit for the counter 42 is shown in FIG. 3 and has the advantage that the mode of operation is cyclic; it is not necessary to establish a datum state. The counter consists of a ring of four bistable flip-flops 46. The Q output of each flip-flop, i.e., the output corresponding to the S input, is connected to the S input of the next flip-flop through a corresponding AND gate 47. Similarly each $\overline{Q}$ output is connected to the next R input through a corresponding AND gate 48. If therefore the gates 47 are enabled, a "1" in any flip-flop 46 propagates into the next flip-flop and the total number of "1's" is increased by 1. The gates 47 are in fact enabled by the pulse on line 43 from the divider 36 (FIG. 1) and in this way each such pulse causes the counter 42 to count up 1.

In a similar way, if the gates 48 are enabled by a signal on the line 50 from the charge generator 20, a "O" in any flip-flop propagates into the next and reduces by 1 the number of "1's" in the flip-flops.

When any two flip-flops are in the "1" state, the signal to the standard charge generator 20 on line 33 is provided by a four input gate 51 coupled to all the Q outputs and biased to conduct when any two Q outputs are true. It follows that, in the absence of an overload, the counter will progress cyclically through the states indicated in Table I.

TABLE I

| | | | | |
|---|---|---|---|---|
| | 1 | 0 | 0 | 0 |
| UP | 1 | 1 | 0 | 0 |
| DOWN | 0 | 1 | 0 | 0 |
| UP | 0 | 1 | 1 | 0 |
| DOWN | 0 | 0 | 1 | 0 |
| UP | 0 | 0 | 1 | 1 |
| DOWN | 0 | 0 | 0 | 1 |
| UP | 1 | 0 | 0 | 1 |
| DOWN | 1 | 0 | 0 | 0 |

If however an overload exists, another pulse on line 33 appearing before the DOWN pulse appears on line 50 will cause the counter to assume a state in which three flip-flops are set, e.g., as in Table II.

TABLE II

| | | | | |
|---|---|---|---|---|
| | 1 | 0 | 0 | 0 |
| UP | 1 | 1 | 0 | 0 |
| UP | 1 | 1 | 1 | 0 |

Another four input gate 52 is coupled to all the Q outputs of the flip-flops and is biased to conduct when any three Q outputs are true. The output of this gate thus provides the overload signal on line 44. If an overload persists it is clear that the counter 42 will alternately have two "1's" therein and three "1's" therein and the average times in such states will automatically assume that ratio which inhibits the $v$ to $f$ converter 14 for such a proportion of its time that its average pulse rate during the overload equals the maximum permitted rate. Once the overload disappears the counter will get back to a state of a single "1" and then alternate a single "1" and two "1's."

The circuit described is incapable of entering the blocked state of all "0's," because a DOWN pulse cannot be provided when there is only a single "1" in the counter. Neither can it enter the blocked state of all "1's" because the signal on line 44 prevents further pulses emanating from the $v$ to $f$ converter.

Figure 4:
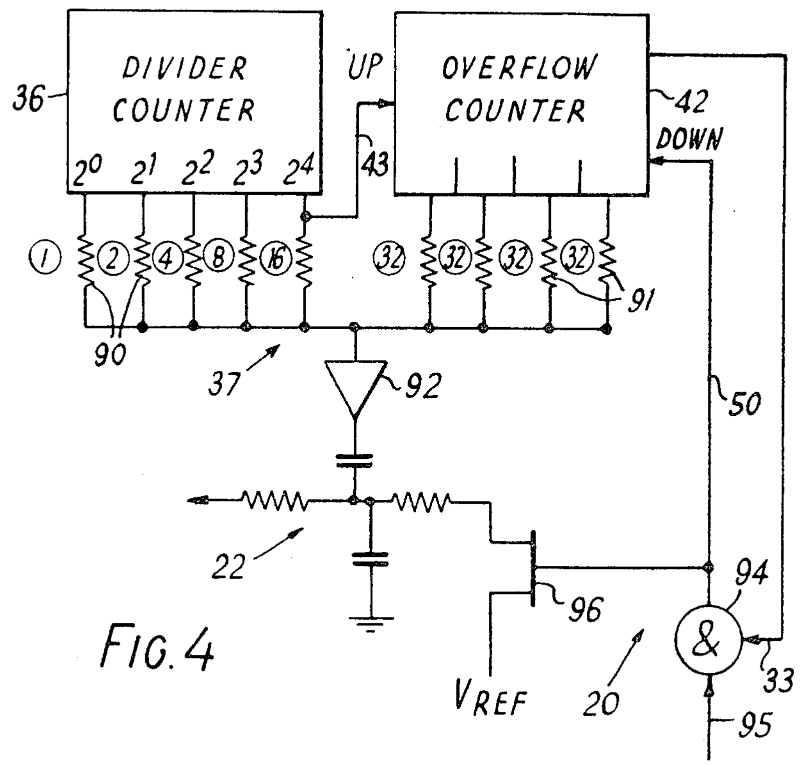
FIG. 4 shows details of a digital to analogue converter in FIG. 1.
Figure 5:
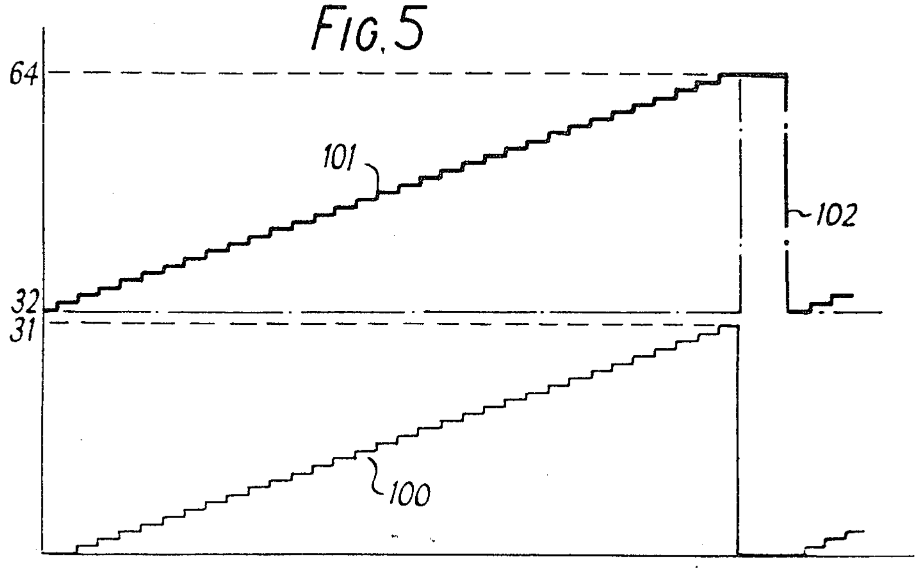
FIG. 5 shows explanatory waveforms relating to FIG. 4.

FIG. 4 shows the counters 36 and 42, the digital to analogue converter 37 and the charge generator 20 in more detail, and FIG. 5 illustrates the derivation of the waveform ($c$) of FIG. 2 in more particularity.

The converter 37 includes not only five resistors 90 controlled respectively by the five stages of the counter 36 but includes four resistors 91 controlled by the four stages of the counter 42. When any stage of the counter 36 holds a "1" a current is contributed to the summing junction at the input of an amplifier 92 with a weight indicated by the figure in a circle adjacent the corresponding resistor 90. These weights progress from 1 to 16. When any stage of the counter 42 holds a "1" a current with a weight of 32 is contributed through the corresponding resistor 91.

FIG. 5 shows the combined current from the resistors 90 in full lines and the conbined current from the resistors 91 in chain dotted lines, the total of these two currents being shown by a heavy full line. Initially there is one "1" in the counter 42, so a 32-bit current flows. The counter 36 is all zeroes. The pulses from the $v$ to $f$ converter 14 cause the counter 36 to count 1, 2, 3, etc., generating a staircase ramp 100 (FIG. 5) which climbs to a 31-bit current. The current 36 then overflows and resets to zero to remove this current, but the overflow pulse on line 43 counts the counter 42 up to two "1'5," whereby a 64-bit current flows via two resistors 91. The total current 101 thus ramps up from 32 bits to 64 bits and holds this value until the signal arrives on line 50 to count the counter 42 down again.

The two "1's" in the counter 42 open the gate 51 and the resulting signal on line 33 enables a gate 94 in the charge genarator 20. The next pulse from the oscillator 30 on line 95 passes through the gate 94 and appears as the count down pulse on line 50 and also closes the switch 96 to pass the standard charge pulse shown at ($a$) in FIG. 2.

Since the counter 42 has been simultaneously counted down to a single "1" the current 101 drops to 32 bits again and the described cycle recommences. The output current from the digital to analogue converter repeatedly ramps up to 64 bits, drops back sharply to 32 bits, ramps up to 64 bits again and so on. The fact that there is a large DC component in the current is immaterial; it is simply blocked by the capacitor 38, providing waveform ($c$) of FIG. 2 with a mean DC level of zero. It should be mentioned that FIG. 2 ($c$) shows the waveform with smoothing; the unsmoothed waveform is shown in FIG. 5.

Since the pulse which passes through the gate 94 simultaneously counts down the counter 42 and generates the standard charge pulse via the switch 96, the sharp fall 102 in the waveform 101 of FIG. 5 is synchronous with the leading edge of the pulse ($a$) of FIG. 2. This is essential if the properly smoothed resultant ($d$) of FIG. 2 is to be achieved at low frequencies of the converter 14.

Returning again to FIG. 1, an automatic calibration circuit 56 is provided which periodically connects a standard cell 57 to the input of the instrument and checks the resulting count in the counter 28. If errors exists, two corrections are derived. One is a zero offset correction applied by way of a connection 58 to the differential amplifier 19 so as to effect fine adjustment of the reference offset signal from the source 18. The second correction consists of small pulses of charge fed into the filter 22 via a connection 59, synchronously with the provision of units of charge by the generator 20 by virtue of a connection 60.

It will be apparent that the correction effected via the connection 59 is equivalent to altering the slope of the $f$ to $v$ converter 20, i.e., the constant of proportionality relating $v$ to $f$. The linearity of the instrument is assured by virtue of the linearity of the $f$ to $v$ converter 22, and the overall potentiometric feedback arrangement, and that being so, errors are corrected throughout the whole range of the instrument by adjusting zero offset and slope.

Figure 6:
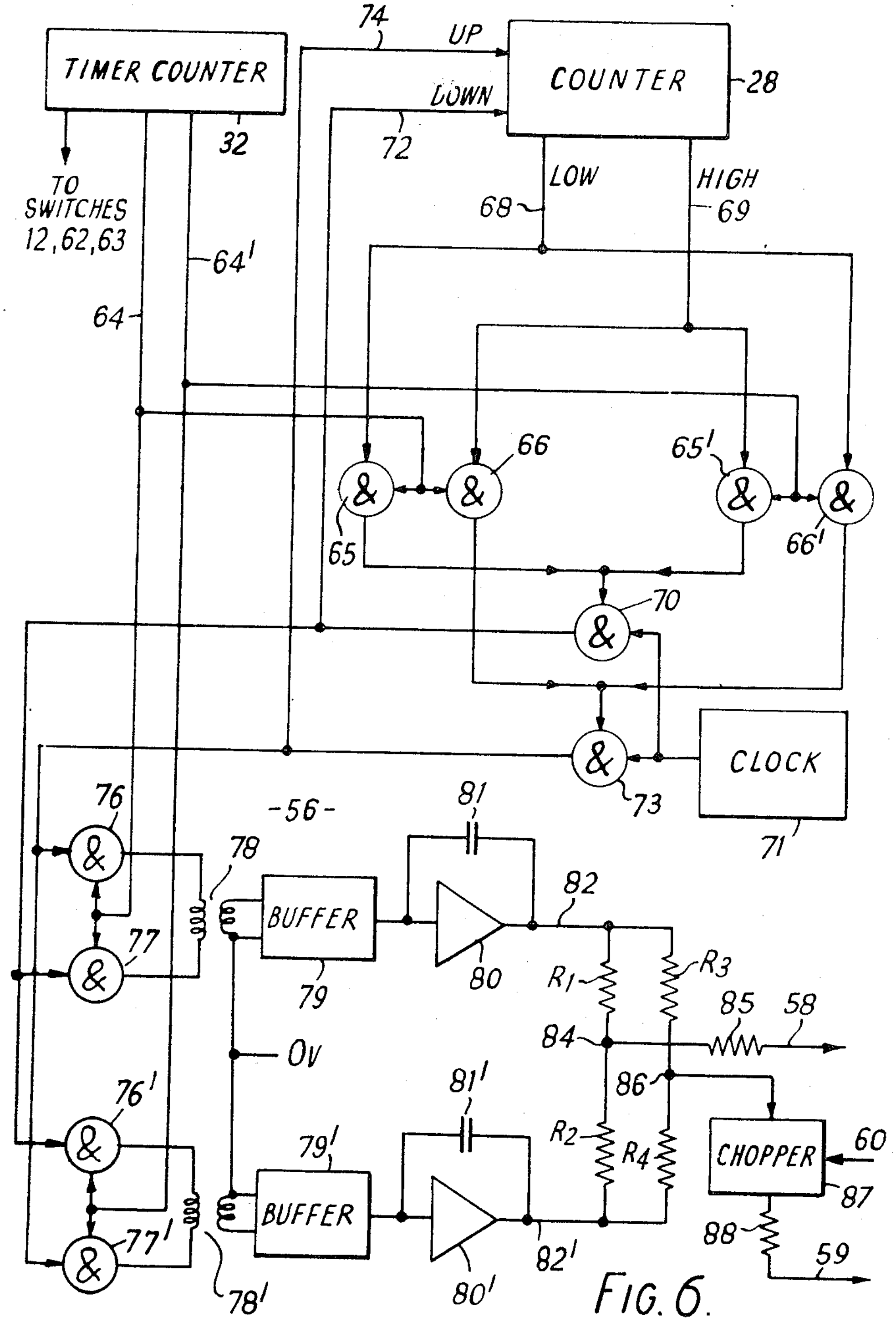
FIG. 6 shows the details of an automatic calibration circuit.

The calibration circuit is shown more fully in FIG. 6. The operation thereof is controlled by the timer counter 32 in FIG. 1 but details of this are not shown for simplicity and clarity since it is well known in instruments of this nature to time various sequences of operations, including those involved in periodic automatic calibration.

Briefly however, when calibration is to be effected, the timer counter 32 opens the switches 12, then connects the cell 57 via switches 62 to provide a positive reference input and subsequently connects the cell via switches 63 to provide a negative reference input. Thus what will be termed positive and negative calibration take place sequentially. In each case a full measurement interval elapses and the counter 28 provides the digital equivalent of the reference input.

Referring to FIG. 6, at the end of the positive calibration measurement interval, the timer counter 32 provides a signal on a line 64 to enable gates 65 and 66 connected to two outputs 68 and 69 of the counter 28. The counter is arranged, in a manner known per se, to provide a LOW signal on line 68 when it is below the reference number (200,000 in this embodiment) which corresponds to the positive reference input. The counter provides a HIGH signal on line 69 when it is above the reference number. Both the LOW and HIGH signals disappear when the counter holds the reference number. (Actually they both disappear when the reference number is approached from below. This makes no real difference to the operation; if the reference number is approached from above the reference number is overshot, the HIGH signal is replaced by the LOW signal which disappears when the counter swings back up to the reference number). Thus signals on lines 68 and 69 respectively indicate during positive calibration that the instrument has over-read and under-read the reference input. If a signal passes from line 68 through gate 65 it opens a gate 70 to allow pulses from a supplementary clock source 71 to pass to an input 72 which counts the counter 28 down. Conversely, is a signal passes from line 69 through gate 66 it opens a gate 73 to allow pulses from the source 71 to pass to an input 74 which counts the counter 28 up. In either event the counter 28 will be corrected to the reference number, so that there is no signal on either line 68 or 69.

Any pulses which pass through the gate 70 or the gate 73 during positive calibration pass through a gate 76 or 77, these two gates being enabled by the signal on line 64. Such pulses pass through the primary of a transformer 78 in a direction determined by which of the gates 70 and 73 they emanated from. The secondary of the transformer 78 is coupled through a buffer stage 79, which standardises the size of the pulses to a sample and hold amplifier 80, i.e., an operational amplifier with a feedback capacitor 81. The voltage on the output 82 of the amplifier 80 will be called the positive calibration voltage. For the avoidance of confusion it must be emphasised that this is a small voltage which may have either polarity, depending on the sense of the pulses integrated by the amplifier 80.

A negative calibration voltage is similarly derived by a circuit which is in part common with that just described and for the rest uses like components which are given like reference numbers with added primes. The differences to note are firstly that the lines 68 and 69 are connected the other way round to the gates 65' and 66' respectively, since the reference number is a full house number which corresponds to both the positive and negative calibration voltages but is approached in the opposite direction during negative calibration compared with positive calibration. Secondly the connections from the gates 70 and 73 to the gates 76' and 77' are reversed with respect to those to the gates 76 and 77.

It is clearly necessary to take account of the interaction between the corrections to slope and zero offset. For this reason a first correction voltage is taken from the junction 84 of resistors $R_1$ and $R_2$ connected between the outputs 82 and 82' at which appear the positive and negative calibration voltages respectively. This first correction voltage (which can be positive or negative) causes current to flow through a resistor 85 and hence in the line 58 already shown in FIG. 1. This current adds to or subtracts from the current which is caused to flow into the amplifier 19 by the reference offset voltage and thus adjusts the zero of the instrument.

A second correction voltage is similarly taken from the junction 86 of resistors $R_3$ and $R_4$ and applied to a chopper 87 whose output is connected through a resistor 88 to the line 59 which feeds into the filter 22 (FIG. 1). The chopper 87 is driven via the line 60 synchronously with the standard charge generator 20 so that very small correcting increments of charge flow through the resistor 88 to add to or subtract from those provided by the circuit 20.

The relative values of the resistors $R_1$ to $R_4$ will be determined by the points on the calibration line of the instrument to which the positive and negative reference voltages correspond. Four resistors have been shown to cover the general case but in the special case in which the two reference voltages are equal and opposite, $R_3$ and $R_4$ should be equal and either $R_1$ or $R_2$ should be omitted, leaving that one which gives the required error correcting effect round the whole loop established by the calibration circuit 56. Obviously to use the wrong one of $R_1$ and $R_2$ would create a degenerative loop. The resistors 85 and 88 are made of the correct size (by calculation or empirically) to give sufficient corrective action, but without over-correction occurring.

It will be noted that all parts of the circuit in any way involved in the analogue signals are coupled to the purely digital parts by the transformers 26, 31, 78 and 78'. The first-mentioned parts can all be shielded within a guard box which also contains its own stabilized power supply circuit energised via another transformer coupling.

I claim:

1. An analogue to digital converter comprising a voltage to frequency converter responsive to the voltage difference between the input voltage and a feedback voltage to provide pulses at a rate proportional to the input voltage; and a feedback circuit responsive to said pulses to provide the feedback voltage, said feedback circuit comprising counter means for dividing said pulses by a number N to provide further pulses, a smoothing filter, charge generating means responsive to each of said further pulses for feeding a fixed pulse charge into said smoothing filter whose output provides the feedback voltage, a digital to analogue converter responsive to said counter means to provide an analog signal, and a.c. coupling means for coupling said analog signal into said smoothing filter said analog signal having a cyclic staircase waveform which at least partially cancels the a.c. component of the smoothed pulses of charge.

2. An analogue to digital converter according to claim 1, wherein said counter means is a binary counter and said charge generating means responds to a most significant bit from said counter means going to "1" and a signal from said charge generating means sets a most significant element of said counter means to "0" synchronously with the end of the said fixed pulse charge.

3. An analogue to digital converter according to claim 2, wherein said counter means comprises a most significant portion with a plurality of stages each of which, when set to "1," contributes an input of one most significant bit to the digital to analogue converter, this most significant portion having a datum state in which one stage is set to "1," being responsive to the preceding portion of the counter to count up to one each time the said preceding portion overflows and being responsive to the charge generating means to count down one synchronously with the end of the said fixed pulse of charge.

4. An analogue to digital converter according to claim 3, comprising means responsive to the presence of three "1's" in the said most significant portion to signal an overload condition.

5. An analogue to digital converter according to claim 4, wherein the means which signal an overload condition inhibit the voltage to frequency converter so long as the overload condition is signalled.

6. An analogue to digital converter according to claim 1, wherein the said a.c. coupling means comprises a capacitor in parallel circuit arrangement with said smoothing filter.

7. An analogue to digital converter according to claim 1 wherein said feedback circuit comprises a differential amplifier with an output terminal and two input terminals and a source of a reference offset voltage, the feedback voltage being applied to one input terminal of said differential amplifier and said reference offset voltage is applied to said other input terminal of said differential amplifier whose output provides the voltage which is differenced with the input voltage.

8. An analogue to digital converter according to claim 7, comprising a smoothing capacitor in parallel circuit arrangement with said differential amplifier.

9. An analogue to digital converter according to claim 7, further comprising a range switching attenuator connected to attenuate the feedback voltage output of said differential amplifier.

10. An analogue to digital converter according to claim 1, further comprising automatic calibration circuit means for effecting calibration with a selected one of two different reference inputs including means for deriving two corresponding calibration voltages, and means responsive to these two calibration voltages for deriving both an offset correction voltage for correcting zero offset and a slope correction voltage which adjusts the slope of the frequency to voltage converter.

11. An analogue to digital converter according to claim 10, wherein the offset correction voltage is combined with the feedback voltage.

12. An analogue to digital converter according to claim 10, comprising a chopper arranged to operate synchronously with said charge generating means to chop the slope correction voltage, the output of said chopper being fed into said smoothing filter.

13. An analogue to digital converter according to claim 10, wherein the two reference inputs are opposite but equal voltages, the offset correction voltage is proportional to one of said two calibration voltages, and the slope correction voltage is the mean of said two calibration voltages.

14. An analogue to digital converter according to claim 10, and further comprising a measurement counter for counting the pulses from the voltage to frequency converter, wherein the calibration circuit is adapted, following measurement of each reference input, to apply correction pulses to said measurement counter, thereby to adjust said measurement counter to a reference count corresponding to the reference input, the calibration circuit comprising for each reference input a corresponding integrating circuit arranged to integrate the correction pulses to derive the corresponding calibration voltage.

15. An analogue to digital converter of the type comprising a voltage to frequency converter responsive to the input voltage, further comprising a counter responsive to the output of the voltage to frequency converter to count in one sense, and means for causing the counter to count in the other sense at intervals, which intervals are short compared with the measurement interval, whereby so long as no overload input exists the counts in the other sense balance those in the one sense, whereas an overload input causes the counter to reach a particular state signalling the overload.

16. An analogue to digital converter according to claim 15, comprising a charge generating circuit which generates a fixed pulse of charge each time the counter counts in one sense, means for smoothing the fixed pulses of charge to generate a feedback voltage opposing the input voltage, and wherein the counter is caused to count in the other sense at the end of each said fixed pulse of charge.

17. An analogue to digital converter according to claim 15, comprising means for inhibiting the voltage to frequency converter when an overload is signalled.

18. An analogue to digital converter according to claim 15, wherein the counter comprises a plurality of bistable flip-flops, first gates and second gates, the flip-flops being connected in a ring firstly through the first gates which, when enabled, cause a "1" in any flip-flop to propagate also into the next flip-flop, and secondly through the second gates which, when enabled, cause a "0" in any flip-flop to propagate also into the next flip-flop, the counter being caused to count in the one sense and the other sense by enabling the first and second gates respectively.

19. An analogue to digital converter comprising a voltage to frequency converter responsive to the difference between the input voltage and a feedback voltage to provide pulses at a rate proportional to the input voltage, a frequency to voltage converter responsive to the said pulses to provide the feedback voltage, and an automatic calibration circuit arranged to effect calibration with two different reference inputs and to derive two corresponding calibration voltages, and means responsive to these two voltages to derive both an offset correction voltage for correcting zero offset and a slope correction voltage which adjusts the slope of the frequency to voltage converter.

20. An analogue to digital converter according to claim 19, wherein the offset correction voltage is combined with the feedback voltage.

21. An analogue to digital converter according to claim 19, comprising a chopper arranged to chop the slope correction voltage synchronously with the said pulses, the output of the chopper being fed into the frequency to voltage converter in combination with the said pulses.

22. An analogue to digital converter according to claim 19, wherein the two reference inputs are opposite but equal voltages, the offset correction voltage is one of the two calibration voltages, and the slope correction voltage is the mean of the two calibration voltages.

23. An analogue to digital converter according to claim 19, comprising a measurement counter which counts the pulses from the voltage to frequency converter, wherein the calibration circuit is adapted, following measurement of each reference input, to apply correction pulses to the measurement counter, thereby to adjust the measurement counter to a reference count corresponding to the reference input, the calibration circuit comprising for each reference input a corresponding integrating circuit arranged to integrate the correction pulses to derive the corresponding calibration voltage.

* * * * *